US008567746B2

(12) United States Patent
Li

(10) Patent No.: US 8,567,746 B2
(45) Date of Patent: Oct. 29, 2013

(54) MOUNTING APPARATUS FOR FAN MODULE

(75) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/407,843

(22) Filed: Feb. 29, 2012

(65) Prior Publication Data
US 2012/0326002 A1 Dec. 27, 2012

(30) Foreign Application Priority Data
Jun. 23, 2011 (CN) .......................... 2011 1 0171304

(51) Int. Cl.
*F16M 1/00* (2006.01)
*H05K 5/00* (2006.01)
*H05K 7/20* (2006.01)

(52) U.S. Cl.
USPC ................. 248/674; 248/220.22; 361/679.48; 361/695

(58) Field of Classification Search
USPC ............. 248/674, 27.1, 27.3, 220.22, 222.11, 248/222.52, 227.4; 361/679.46–679.54, 361/688–723; 454/184; 415/206; 165/80.1–80.5, 185, 121, 126
See application file for complete search history.

(56) References Cited

U.S. PATENT DOCUMENTS

| 2,665,166 | A  | * | 1/1954 | Roark .......................... 296/97.9 |
| 5,178,353 | A  | * | 1/1993 | Huxtable .................. 248/222.52 |
| 6,244,953 | B1 | * | 6/2001 | Dugan et al. ................... 454/184 |
| 6,270,046 | B1 | * | 8/2001 | Liu et al. ..................... 248/231.9 |
| 6,435,889 | B1 | * | 8/2002 | Vinson et al. .................. 439/247 |
| 6,711,015 | B2 | * | 3/2004 | Syring et al. .................. 361/695 |
| 6,839,233 | B2 | * | 1/2005 | Cravens et al. ............... 361/695 |
| 7,002,796 | B2 | * | 2/2006 | Lao et al. ...................... 361/695 |
| 7,245,490 | B2 | * | 7/2007 | Chou et al. ................... 361/695 |
| 7,481,704 | B2 | * | 1/2009 | Kao et al. ...................... 454/184 |
| 7,522,415 | B2 | * | 4/2009 | Fan et al. ...................... 361/695 |
| 7,546,998 | B2 | * | 6/2009 | Chen ............................. 248/674 |
| 7,580,259 | B2 | * | 8/2009 | Hsiao ............................ 361/695 |
| 7,697,287 | B2 | * | 4/2010 | Yin ............................... 361/695 |
| 7,699,692 | B2 | * | 4/2010 | Yin ............................... 454/184 |
| 7,920,384 | B2 | * | 4/2011 | Westphall et al. ............ 361/727 |
| 8,246,301 | B2 | * | 8/2012 | Li ............................... 415/213.1 |
| 2003/0155471 | A1 | * | 8/2003 | Dean et al. .................... 248/27.1 |
| 2007/0035924 | A1 | * | 2/2007 | Westphall et al. ............ 361/687 |
| 2008/0142674 | A1 | * | 6/2008 | Dang et al. .................... 248/674 |
| 2010/0232976 | A1 | * | 9/2010 | Li .............................. 416/244 R |

FOREIGN PATENT DOCUMENTS

DE           3404645 A1 *  8/1985   ............... E05C 3/00

* cited by examiner

*Primary Examiner* — Jonathan Liu
*Assistant Examiner* — Guang H Guan
(74) *Attorney, Agent, or Firm* — Altis & Wispro Law Group, Inc.

(57) ABSTRACT

A mounting apparatus for securing a fan module comprises a chassis, two mounting members, and an installing member rotatably secured to the fan module. The enclosure comprises two substantially parallel sidewalls. Two mounting members are rotatably secured to the two sidewalls. Each of two mounting members is provided with a limiting portion. A pivot is defined in the installing member. The limiting portion is received in the pivot hole for engagement or disengagement from the pivot hole by rotating the installing member.

16 Claims, 5 Drawing Sheets

MOUNTING APPARATUS FOR FAN MODULE

BACKGROUND

1. Technical Field

The present disclosure relates to mounting apparatuses, and particularly to a mounting apparatus to secure a fan module to an electronic device chassis.

2. Description of Related Art

In a working computer system, a large amount of heat is generated from various electric elements of the computer system. If the heat is not dissipated in a timely manner, the electric elements may be damaged. Therefore, heat-dissipating devices are required in most computer systems.

A fan module is often used to dissipate heat from the computer system. A chassis may be provided for mounting a fan module. A plurality of through holes may be defined in the chassis. The fan module may define a plurality of screw holes. The through holes of the chassis are aligned with the screw holes of the fan module. A plurality of screws extends through the through holes to screw into the screw holes. The fan is thereby secured to the chassis of the computer system. However, the screw mounting means in assembly and disassembly of the fans is very labor-intensive and inconvenient.

Therefore, there is room for improvement within the art.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 2:
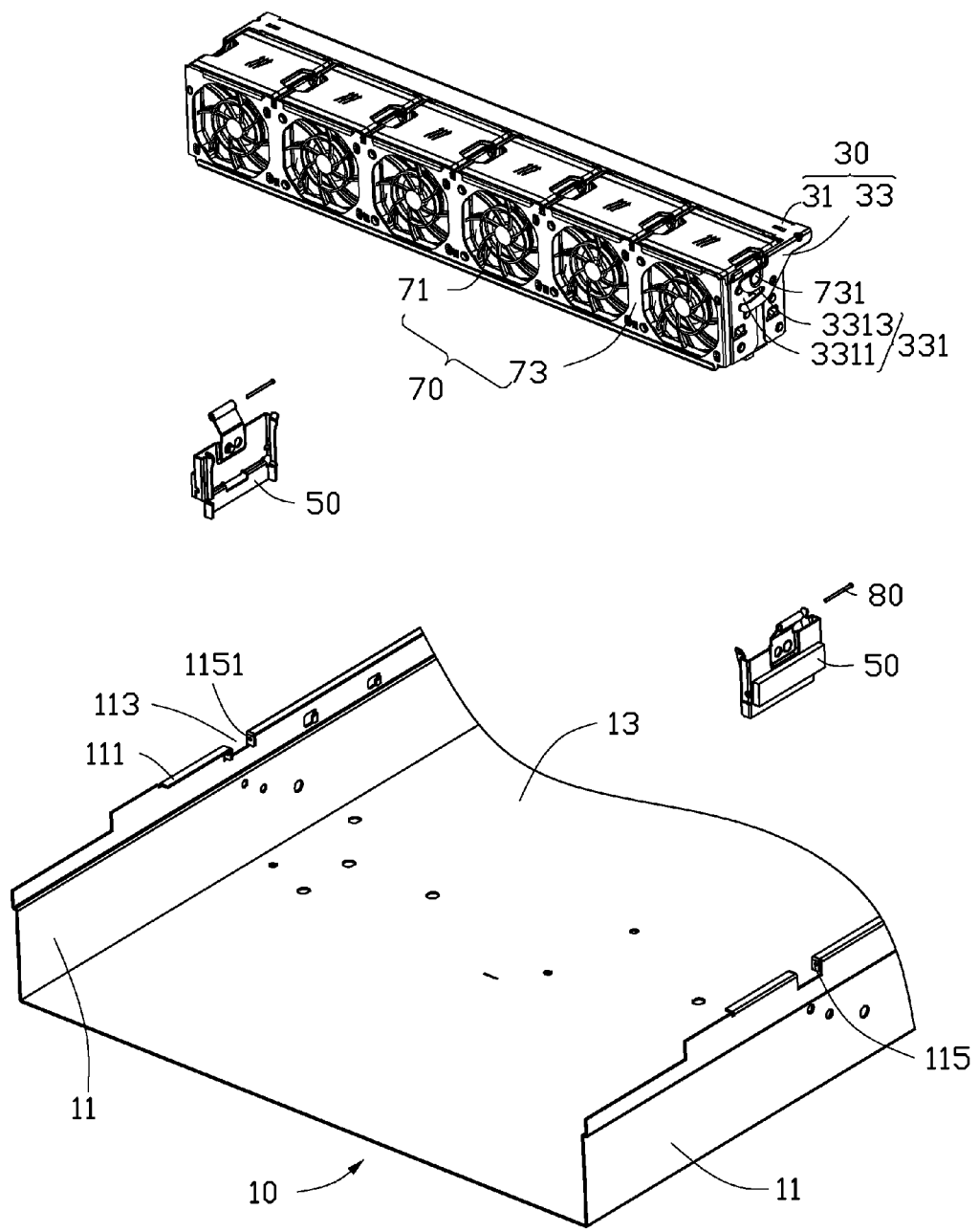
FIG. 2 is an exploded view of the mounting apparatus and the fan module of FIG. 1.

Referring to FIG. 2, a mounting apparatus in accordance with an embodiment comprises a chassis 10, an installation member 30, and two mounting members 50 secured to the chassis 10. The mounting apparatus is configured for securing a fan module 70 to the chassis 10. The fan module 70 comprises a plurality of fans 71, and a bracket 73 for receiving the plurality of fans 71. Two pivot portions 731 are placed on two opposite sides of the bracket 73.

The chassis 10 comprises two sidewalls 11 parallel to each other, and a bottom board 13 connected to the two sidewalls 11. A folding edge 111 extends inwardly from each of the two sidewalls 11. The folding edge 111 defines a cutout or a gap 113. Two installation pieces 115 substantially parallel to each other, extend from each of the two sidewalls 11 and are located on opposite sides of the gap 113. Each of the two installation pieces 115 defines an installation hole 1151. In one embodiment, each of the two installation pieces 115 is substantially perpendicular to each of the two sidewalls 11.

The installation member 30 comprises an installation board 31 and two pivot pieces 33. The two pivot pieces 33 extend from two opposite ends of the installation board 31. Each of the two pivot pieces 33 defines a pivot hole 331. The pivot hole 331 comprises a wide portion 3311 and a narrow portion 3313 communicating with the wide portion 3311.

Figure 3:
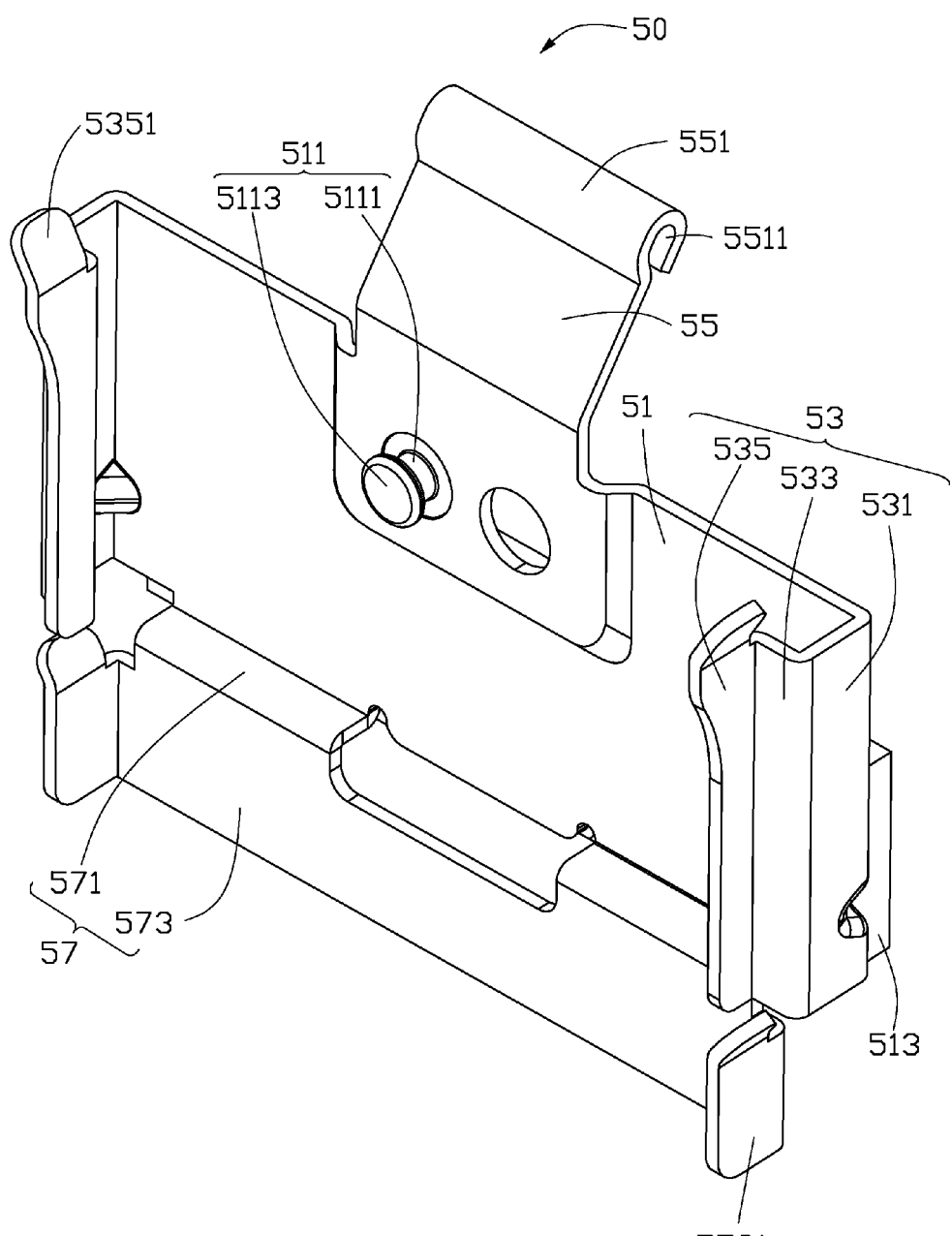
FIG. 3 is an isometric view of a mounting member of the mounting apparatus of FIG. 1.

Referring to FIG. 3, each of two mounting members 50 comprises a connecting board 51, two clipping portions 53 located on two opposite sides of the connecting board 51, a pulling portion 55 extending from the connecting board 51, and a extending portion 57. In one embodiment, the two clipping portions 53, the pulling portion 55 and the extending portion 57 are arranged at the four sides of the connecting board 51.

A limiting portion 511 is located on the connecting board 51, and the limiting portion 511 comprises a neck portion 5111 extending from connecting board 51, and a head portion 5113 extending from the neck portion 5111. In one embodiment, a diameter of the neck portion 5111 is smaller than that of the head portion 5113. An abutting piece 513 is located on the connecting board 51, and is opposite to the limiting portion 511. The abutting piece 513 is adapted to absorb vibration.

Each of the two clipping portions 53 comprises a connecting portion 531 extending from the connecting board 51, a converting portion 533 extending from the connecting portion 531, and a gripping portion 535 extending from the converting portion 533. In one embodiment, the connecting portion 531 is substantially perpendicular to the connecting board 51, the converting portion 533 is substantially perpendicular to the connecting portion 531 and parallel to the connecting board 51, and the gripping portion 535 is substantially perpendicular to the converting portion 533 and the connecting board 51. A guiding portion 5351 extends upward from gripping portion 535.

An end of the pulling portion 55 forms a rotating portion 551, and a mounting hole 5511 is defined in the rotating portion 551. In one embodiment, an obtuse angle is defined between the pulling portion 55 and the connecting board 51.

The extending portion 57 comprises a bent portion 571 extending from the connecting board 51, and a leaning portion 573. In one embodiment, the bent portion 571 is substantially perpendicular to the connecting board 51 and the leaning portion 573 is substantially perpendicular to the bent portion 571. Two holding portions 5731 are located on two opposite sides of the leaning portion 573. In one embodiment, each of the two holding portions 5731 is substantially perpendicular to the leaning portion 573.

Figure 1:
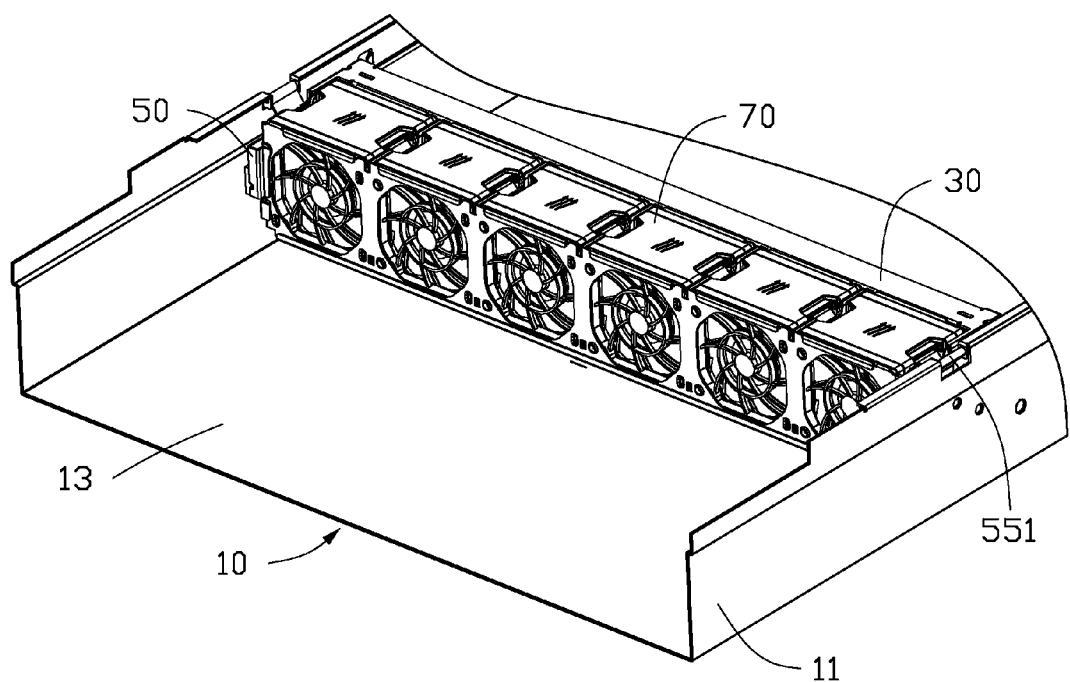
FIG. 1 is an assembled view of an embodiment of mounting apparatus and a fan module.
Figure 4:
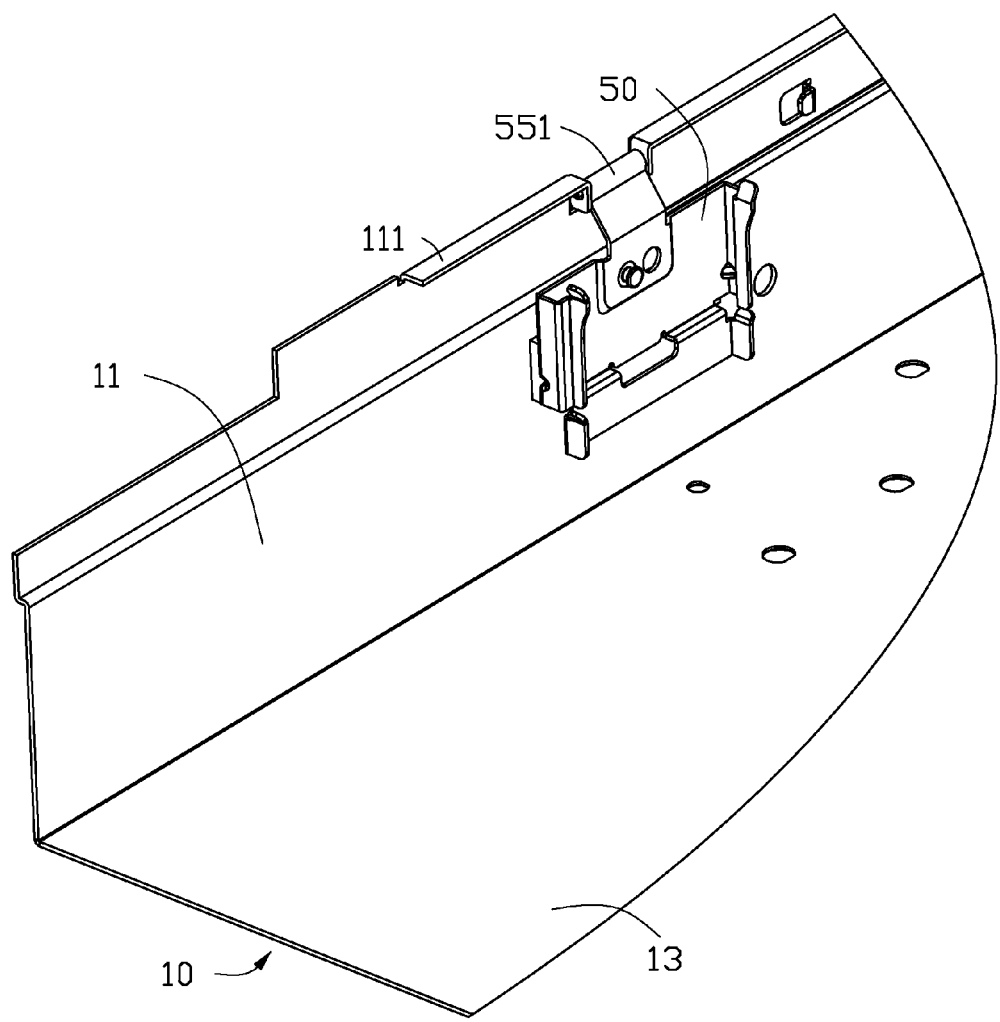
FIG. 4 is a cutaway, assembled view of the chassis and the mounting member of FIG. 1.

Referring to FIGS. 1 and 4, in assembly, the rotating member 551 of one of the two mounting members 50 is placed in the gap 113 of the chassis 10, the abutting piece 513 abuts the corresponding one of the two sidewalls 11. Two opposite ends of the mounting hole 5511 are aligned with two installation holes 1151, and the locking member 80 extends through one of the two installation holes 1151, the mounting hole 5511 and another of the two installation holes 115 to pivotably secure one of the two mounting members 50 to one of the two sidewalls 11. Another one of the two mounting members 50 is pivotably secured to another one of the two sidewalls 11 in the same manner.

Figure 5:
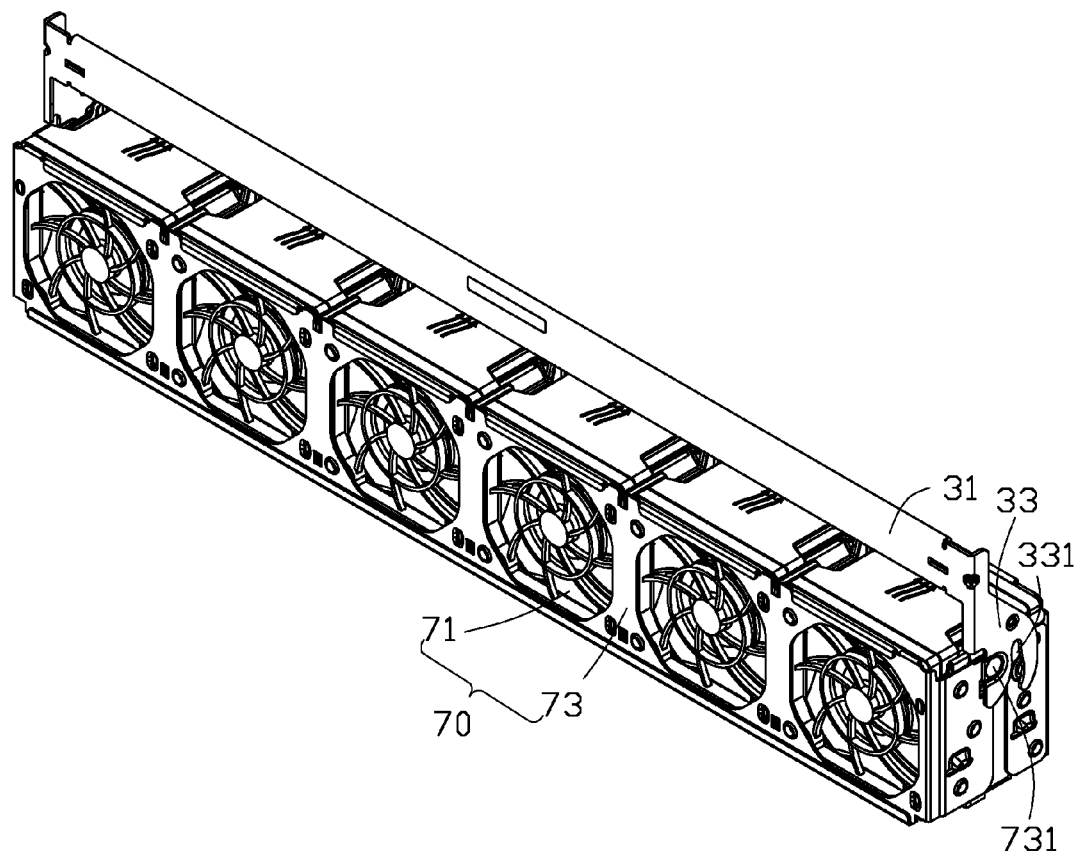
FIG. 5 is a partly assembled view of the fan module and the installation member of FIG. 1.

In assembly, the installation board 31 is put up in a third direction (shown in FIG. 5). Each of the two pivot pieces 33 is adaptor to be rotated along the two pivot portions 731, until the pivot hole 331 aligns with the neck portion 5111 of each of the two mounting members 50. The fan module 70 descends along the guiding portion 5351 of the gripping portion 535. The neck portion 5111 extends through the wide portion 3311 of the pivot hole 331, until the neck portion 5111 engages in the narrow portion 3313. The installation board 31 is rotated in a fourth direction opposite to the third direction, until each of the two pivot pieces 33 engages with the bracket 73. Thereby, the fan module 70 is engaged between the two mounting members 50 to prevent from the fan module from moving in a first direction substantially perpendicularly to the two sidewalls 11, and in a plane which is substantially parallel with the two sidewalls 11. The neck portion 5111 is engaged in the narrow portion 3313 to prevent the fan module 70 from moving in a second direction substantially perpendicularly to the first direction and the plane. Each of the two pivot pieces 33 is located between the connecting board 51 and the bracket 73. The bracket 73 is clipped between two the gripping portions 535 and the two holding portions 5731, and the leaning portion 573 abuts the adjacent side of the bracket 73. In this way, the fan module 70 is secured to the chassis.

In disassembly, the installation board 31 is put up to rotate each of the two pivot pieces 33 along the third direction, until the pivot hole 331 aligns with the bottom board 13 of the chassis 10. The fan module 70 is moved away from the chassis 10. The neck portion 5111 is moved from the narrow portion 3313 to the wide portion 3311. Thus, the fan module 70 can be removed from the chassis 10.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A mounting apparatus comprising:
a chassis, the chassis comprising two sidewalls parallel to each other;
two mounting members, each of the two mounting members rotatably secured to each of the two sidewalls and comprising a connecting board, two clipping portions located on the connecting board, an abutting piece located on one side of the connecting board, a pulling portion extending from the connecting board, and a limiting portion located on another side of the connecting board; the connecting board of each of the two mounting members configured to clamp a fan module to prevent the fan module from moving in a first direction substantially perpendicular to the two sidewalls, and the two clipping portions of each of the two mounting members configured to clamp the fan module to prevent the fan module from moving in a plane substantially parallel to the two sidewalls, the abutting piece of each of the two mounting members abutting each of the two sidewalls for absorbing vibration, the pulling portion of each of the two mounting members being secured to each of the two sidewalls, and an obtuse angle being defined between the connecting board and the pulling portion; and
an installation member configured to rotatably secure to the fan module, the installation member comprising two pivot pieces, and each of the two pivot pieces defining a pivot hole,
wherein the limiting portion is received in the pivot hole for preventing the fan module from moving in a second direction, the second direction being substantially perpendicular to the first direction and substantially parallel to the plane; and the installation member is rotatable relative to the fan module to disengage the limiting portion from the pivot hole;
an end of the pulling portion forms a rotating portion, the chassis comprises two installation pieces extending from each of the two sidewalls and substantially parallel to each other, the rotating portion is pivotably engaged between the two installation pieces; and
the rotating portion defines a mounting hole, each of the two installation pieces defines an installation hole, and each of the two mounting members is rotatably secured to each of the two sidewalls by a locking member extending through the installation holes and the mounting hole.

2. The mounting apparatus of claim 1, wherein the pivot hole comprises a wide portion and a narrow portion communicating with the wide portion, the limiting portion extending through the wide portion to be engaged in the narrow portion.

3. The mounting apparatus of claim 2, wherein the limiting portion comprises a neck portion and a head portion, and a diameter of the neck portion is smaller than a diameter of the head portion.

4. The mounting apparatus of claim 3, wherein the neck portion extends from the connecting board and is engaged in the narrow portion, each of the two pivot pieces is located between the head portion and the connecting board.

5. The mounting apparatus of claim 1, wherein each of the two clipping portions comprises a connecting portion extending from the connecting board, a converting portion extending from the connecting portion and a gripping portion extending from the converting portion; the gripping portion of each of the two clipping portions is configured to clamp the fan module, and the connecting portion and the converting portion strengthen the gripping portion.

6. The mounting apparatus of claim 5, wherein the connecting portion is substantially perpendicular to the connecting board, the converting portion is substantially perpendicular to the connecting portion and parallel to the connecting board, and the gripping portion is substantially perpendicular to the converting portion and the connecting board.

7. The mounting apparatus of claim 1, wherein each of the two mounting members comprises an extending portion configured to resist a movement of the fan module, and the extending portion and the pulling portion are located on opposite sides of the connecting board.

8. The mounting apparatus of claim 7, wherein the extending portion comprises a bent portion extending from the connecting board and a leaning portion extending from the bent portion, the bent portion is substantially perpendicular to the connecting board, and the leaning portion is substantially perpendicular to the bent portion and parallel to the connecting board.

9. A mounting apparatus comprising:
a chassis, the chassis comprising two sidewalls substantially parallel to each other;
two mounting members, each of the two mounting members rotatably secured to the two sidewalls and comprising a connecting board, two clipping portions located on the connecting board, an abutting piece located on one side of the connecting board, a pulling portion extending from the connecting board, and a limiting portion located on another side of the connecting board; the connecting board of each of the two mounting members configured to clamp a fan module to prevent the fan module from moving in a first direction substantially perpendicular to the two sidewalls, and the two clipping portions of each of the two mounting members configured to clamp the fan module to prevent the fan module from moving in a plane substantially parallel to the two sidewalls, the abutting piece of each of the two mounting members abutting each of the two sidewalls for absorbing vibration, the pulling portion of each of the two mounting members being secured to each of the two sidewalls, and an obtuse angle being defined between the connecting board and the pulling portion; and an installation member configured to rotatably secure to the fan module, the installation member comprising two pivot pieces, each of the two pivot pieces defining a pivot hole configured to accommodate the limiting portion, the pivot hole comprising a wide portion and a narrow portion communicating with the wide portion, wherein the limiting portion extends through the wide portion to engage in the narrow portion for preventing the fan module from moving in a second direction, the second direction being substantially perpendicular to the first direction and substantially parallel to the plane; and the installation member is rotatable relative to the fan module to disengage the limiting portion from the narrow portion;

an end of the pulling portion forms a rotating portion, the chassis comprises two installation pieces parallel to each other, the rotating portion is pivotably secured between the two installation pieces; and the rotating portion defines a mounting hole, each of the two installation pieces defines an installation hole, and a locking member extends through the two installation holes and the mounting hole to rotatably secure each of the two mounting members to each of the two sidewalls.

10. The mounting apparatus of claim 9, wherein the limiting portion of each of the two mounting members comprises a neck portion and a head portion, a diameter of the neck portion is smaller than a diameter of the head portion.

11. The mounting apparatus of claim 10, wherein the neck portion extends from the connecting board and is engaged in the narrow portion, each of the pivot pieces is located between the head portion and the connecting board.

12. The mounting apparatus of claim 9, wherein each of the two clipping portions comprises a connecting portion extending from the connecting board, a converting portion extending from the connecting portion and a gripping portion extending from the converting portion; the gripping portion of each of the two clipping portions is configured to clamp the fan module, and the connecting portion and the converting portion strengthen the gripping portion.

13. The mounting apparatus of claim 12, wherein the connecting portion is substantially perpendicular to the connecting board, the converting portion is substantially perpendicular to the connecting portion and parallel to the connecting board, and the gripping portion is substantially perpendicular to the converting portion and the connecting board.

14. The mounting apparatus of claim 9, wherein the two installation pieces extend from each of the two sidewalls, and the two installation pieces are substantially perpendicular to each of the two sidewalls.

15. The mounting apparatus of claim 9, wherein each of the two mounting members comprises an extending portion configured to resist a movement of the fan module, and the extending portion and the pulling portion are located on opposite sides of the connecting board.

16. The mounting apparatus of claim 15, wherein the extending portion comprises a bent portion extending from the connecting board and a leaning portion extending from the bent portion, the bent portion is substantially perpendicular to the connecting board, and the leaning portion is substantially perpendicular to the bent portion and parallel to the connecting board.

* * * * *